(12) United States Patent
You et al.

(10) Patent No.: US 10,510,979 B2
(45) Date of Patent: *Dec. 17, 2019

(54) COMPOSITE TRANSPARENT ELECTRODE, OLED AND METHOD FOR MANUFACTURING THEREOF, ARRAY SUBSTRATE AND DISPLAY DEVICE

(71) Applicant: BOE TECHNOLOGY GROUP CO., LTD., Beijing (CN)

(72) Inventors: Juanjuan You, Beijing (CN); Changyen Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/754,526

(22) PCT Filed: Aug. 18, 2017

(86) PCT No.: PCT/CN2017/098004
§ 371 (c)(1),
(2) Date: Feb. 22, 2018

(87) PCT Pub. No.: WO2018/149106
PCT Pub. Date: Aug. 23, 2018

(65) Prior Publication Data
US 2019/0027702 A1   Jan. 24, 2019

(30) Foreign Application Priority Data
Feb. 17, 2017   (CN) ............... 2017 1 0087078

(51) Int. Cl.
*H01L 51/52* (2006.01)
*H01L 51/56* (2006.01)
(Continued)

(52) U.S. Cl.
CPC ...... *H01L 51/5234* (2013.01); *H01L 51/5209* (2013.01); *H01L 51/5215* (2013.01);
(Continued)

(58) Field of Classification Search
CPC ............ H01L 51/5234; H01L 51/5215; H01L 27/3211; H01L 51/5203
See application file for complete search history.

(56) References Cited

U.S. PATENT DOCUMENTS 5,468,988 A * 11/1995 Glatfelter ............ H01L 31/046
136/244
8,853,676 B2 * 10/2014 Sun ..................... H01L 51/5234
257/40

(Continued)

FOREIGN PATENT DOCUMENTS

CN       101114701 A      1/2008
CN       101536608 A      9/2009
(Continued)

OTHER PUBLICATIONS

CN Office Action for CN Appl. No. 201710087078.5, dated Dec. 15, 2017.
(Continued)

*Primary Examiner* — Quoc D Hoang
(74) *Attorney, Agent, or Firm* — Foley & Lardner LLP; James F. Ewing; Paul M. H. Pua

(57) ABSTRACT

A composite transparent electrode, an organic light-emitting diode and a method for manufacturing thereof, an array substrate and a display device. In the composite transparent electrode, a cover layer (12) is provided between a metal layer (11) and a transparent conducting oxide layer (13), the transparent conducting oxide layer (13) is electrically connected to the metal layer (11). The composite transparent
(Continued)

electrode can reduce damages to the metal layer (11) or decrease pressure fall during a sputtering process.

18 Claims, 3 Drawing Sheets

(51) Int. Cl.
*H01L 51/00* (2006.01)
*H01L 27/32* (2006.01)

(52) U.S. Cl.
CPC .......... *H01L 51/5225* (2013.01); *H01L 51/56* (2013.01); *H01L 27/3211* (2013.01); *H01L 51/0021* (2013.01); *H01L 2251/305* (2013.01); *H01L 2251/5315* (2013.01); *H01L 2251/558* (2013.01)

(56) References Cited

U.S. PATENT DOCUMENTS

2009/0322923 A1* 12/2009 Maehara ............... H01L 27/307
                                                        348/308
2014/0160373 A1*  6/2014 Hsu ........................ G06F 3/044
                                                        349/12
2015/0077361 A1    3/2015 Seo et al.
2015/0325803 A1* 11/2015 Lee ....................... H01L 51/442
                                                        257/40

FOREIGN PATENT DOCUMENTS

| | | |
|---|---|---|
| CN | 103000814 A | 3/2013 |
| CN | 103022377 A | 4/2013 |
| CN | 103077833 A | 5/2013 |
| CN | 103151468 A | 6/2013 |
| CN | 104218059 A | 12/2014 |
| CN | 104253242 A | 12/2014 |
| CN | 204230306 U | 3/2015 |
| CN | 104485345 A | 4/2015 |
| CN | 105355800 A | 2/2016 |
| CN | 106784389 A | 5/2017 |

OTHER PUBLICATIONS

Second CN Office Action for CN Appl. No. 201710087078.5, dated Aug. 8, 2018.
International Search Report and Written Opinion for PCT/CN2017/098004, dated Nov. 27, 2017.
Third Office Action for CN Application No. 201710087078.5, dated Mar. 1, 2019.

* cited by examiner

COMPOSITE TRANSPARENT ELECTRODE, OLED AND METHOD FOR MANUFACTURING THEREOF, ARRAY SUBSTRATE AND DISPLAY DEVICE

CROSS-REFERENCE TO RELATED APPLICATIONS

The present application is a U.S. National Stage under 35 U.S.C. § 371 of PCT/CN2017/098004, filed on Aug. 18, 2017, which claims the benefit of and priority to Chinese Patent Application No. 201710087078.5, filed on Feb. 17, 2017, the disclosure of which is incorporated herein in its entirety by reference.

TECHNICAL FIELD

Embodiments of the present disclosure relate to a composite transparent electrode, an Organic Light-Emitting Diode and a method for manufacturing thereof, an array substrate and a display device.

BACKGROUND

An Organic Light-Emitting Diode (OLED) which has significant characteristics such as lightness and thinness, rapid response, adaptability to flexible display and the like is commonly recognized as a new technology in the fields of tablet displaying and illuminating. An OLED generally comprises an anode, a cathode and an organic light-emitting functional layer between the anode and the cathode. With development of the OLED technology and a demand of upgrading product, the market has a higher and higher requirement on low power consumption and high resolution.

A top-emitting Active-Matrix Organic Light-Emitting Diode (AMOLED) panel can avoid blocking of a Thin Film Transistor (TFT), such that relatively high opening rate and brightness can be achieved, i.e., the top-emitting AMOLED panel can reduce power consumption and increase resolution, and at the same time, the lifetime of the OLED can be increased. Thus, the top-emitting AMOLED panel is a preferred technology at present.

SUMMARY

Embodiments of the present disclosure provide a composite transparent electrode, an organic light-emitting diode and a method for manufacturing thereof, an array substrate and a display device. The embodiments of the present disclosure can reduce damages to the metal layer or decrease pressure fall during a sputtering process.

At least one embodiment of the present disclosure provides an organic light-emitting diode, comprising a first electrode, a second electrode, and an organic light-emitting functional layer located between the first electrode and the second electrode, wherein the second electrode is a composite transparent electrode, the composite transparent electrode comprising: a metal layer; a transparent conducting oxide layer, wherein the transparent conducting oxide layer is located on a side of the metal layer away from the organic light-emitting functional layer; and a transparent cover layer located between the metal layer and the transparent conducting oxide layer, wherein the metal layer is electrically connected to the transparent conducting oxide layer.

For example, the transparent cover layer has at least one first hole, through which the metal layer is electrically connected to the transparent conducting oxide layer.

For example, a material of the transparent cover layer comprises a metal oxide having a dielectric constant c in a range of $\varepsilon > 10$.

For example, the transparent cover layer is insulated.

For example, the metal oxide is selected from a group of $Ga_2O_3$, $CaO$ and $WO_3$.

For example, the transparent cover layer has a thickness in a range of 1 to 40 nm.

For example, the transparent cover layer directly contacts the metal layer.

For example, the metal layer has a thickness in a range of 1 to 20 nm.

For example, the metal layer is a transparent metal layer.

For example, the transparent conducting oxide layer has a thickness in a range of 50 to 500 nm.

For example, the at least one first hole comprises the material of the transparent conducting oxide layer therein.

For example, an orthographic projection of the transparent conducting oxide layer on the metal layer is located within an area in which the metal layer is located.

For example, the organic light-emitting functional layer comprises a plurality of subpixels and at least one second hole, wherein the at least one second hole is between adjacent subpixels, and the transparent cover layer covers the subpixels.

For example, along a direction in which the plurality of subpixels are arranged, a size of the at least one first hole is less than or equal to that of the at least one second hole.

For example, an orthographic projection of the subpixels on the metal layer of the composite transparent electrode is located within the orthographic projection of the transparent cover layer on the metal layer.

For example, at least one embodiment of the present disclosure further provides a composite transparent electrode, comprising: a metal layer; a transparent conducting oxide layer; and a transparent cover layer located between the metal layer and the transparent conducting oxide layer. The metal layer is electrically connected to the transparent conducting oxide layer.

For example, the transparent cover layer has at least one first hole, through which the metal layer is electrically connected to the transparent conducting oxide layer; and/or the transparent cover layer exposes a periphery of the metal layer, and a periphery of the transparent conducting oxide layer extends towards the metal layer and is electrically connected to the periphery of the metal layer that is exposed by the transparent cover layer.

At least one embodiment of the present disclosure further provides a method for manufacturing an organic light-emitting diode, comprising: forming a first electrode and an organic light-emitting functional layer; forming the composite transparent electrode as mentioned above on the organic light-emitting functional layer, wherein the transparent conducting oxide layer of the composite transparent electrode is located on a side of the metal layer away from the organic light-emitting functional layer.

For example, the transparent conducting oxide layer is formed by a sputtering process.

At least one embodiment of the present disclosure further provides an array substrate, comprising an electrode layer, the composite transparent electrode according to any of the above embodiments, and an organic light-emitting functional layer located between the electrode layer and the composite transparent electrode, wherein the electrode layer comprises a plurality of sub-electrodes, and the organic light-emitting functional layer comprises a plurality of subpixels.

At least one embodiment of the present disclosure further provides a display device, comprising the array substrate as mentioned above.

BRIEF DESCRIPTION OF THE DRAWINGS

In order to more clearly illustrate the technical solution of the embodiments of the present disclosure, the figures of the embodiments would be briefly introduced below. Obviously, the figures as described below only relate to some embodiments of the present disclosure, but are not limitations on the present disclosure.

Figure 1A:
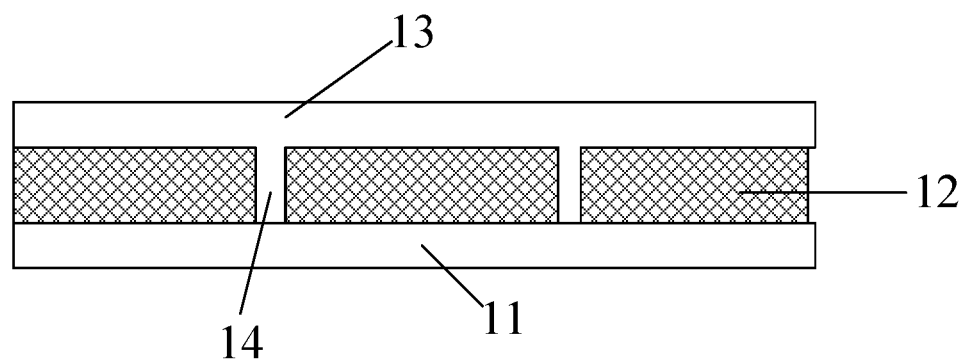
FIG. 1A is a schematic diagram showing a structure of the composite transparent electrode provided by the embodiments of the present disclosure.

Reference numbers: 02: electrode layer; 02a: sub-electrode; 03: organic light-emitting functional layer; 1: composite transparent electrode; 11: metal layer; 12: cover layer; 13: transparent conducting oxide layer; 14: first hole; 2: first electrode; 3: organic light-emitting functional layer; 31: subpixel; 32: second hole; 5: substrate.

DETAILED DESCRIPTION

In order to make the objects, technical solutions and advantages of the embodiments of the present disclosure clearer, the technical solutions of the embodiments of the present disclosure will be described in a clear and complete manner below in conjunction of the figures of the embodiments of the present disclosure. Obviously, the embodiments as described are just a part, instead of all, of the embodiments of the present disclosure. All other embodiments that are obtainable by those skilled in the art based on the embodiments of the present disclosure as described without any inventive effort are encompassed in the protection scope of the present disclosure.

Unless otherwise defined, technological terms or scientific terms used in the present disclosure shall have meanings as commonly understood by those ordinary technicians skilled in the field to which the present disclosure pertains. The terms "first", "second" and similar wordings used in the present disclosure do not mean any order, quantity or importance, but are used only to discriminate different constituents. Likewise, "one", "a" or "the" and similar wordings do not mean limitations on the quantity, but only indicate that there is at least one. The terms "comprising" or "including" and similar wordings mean the element or article appearing before said term contain the element or article appearing after said term and equivalents thereof, without exclusion of other elements or articles. The terms "connected" or "interconnected" and similar wordings are not limited to a physical or a mechanical connection, but may include an electrical connection, either directly or indirectly. Terms such as "up", "down", "left" and "right" are used to show relative position relationship, and when the absolute position of the object as described changes, the relative position relationship may be changed accordingly.

In study, the inventors of the present application found: for manufacturing the transparent electrode in the top-emitting AMOLED, a thin metal transparent electrode is commonly used in a medium-sized or small-sized display product at present. The thin metal transparent electrode has a relatively high impedance, and once its size becomes larger, there would be a problem of pressure fall. Therefore, the thin metal transparent electrode is adaptable to medium and small sizes. In addition, on the surface of a metal transparent electrode, there is usually a heat effect generated by plasmas, such that the light-emitting efficiency is decreased, while a large-sized product usually selects a transparent conducting oxide (TCO) as an electrode, such as indium tin oxide (ITO), indium zinc oxide (IZO) and the like. TCO is advantageous for high transmissivity, and the coated film can be thick. Furthermore, a thick TCO has a high electrical conductivity, and there would not be a problem of pressure fall. However, TCO generally needs to be coated in a sputtering manner, during which high-energy particles usually damage the organic light-emitting functional layer, which would result in problems of electricity leakage, low light-emitting efficiency, short life time and the like.

At least one embodiment of the present disclosure provides a composite transparent electrode. As shown in FIGS. 1A and 1C, the composite transparent electrode comprises a transparent metal layer 11, a transparent conducting oxide layer 13, and a transparent cover layer 12 located between the metal layer 11 and the transparent conducting oxide layer 13, wherein the metal layer 11 is electrically connected to the transparent conducting oxide layer 13. For example, as shown in FIG. 1A, the cover layer 12 has at least one (i.e., one or more) first hole (as shown in the figure, the first hole is a through-hole through the cover layer 12) 14, the metal layer 11 is connected to the transparent conducting oxide layer 13 through the first hole 14, and the material of the transparent conducting oxide layer 13 is filled into the first through-hole 14. For example, as shown in FIG. 1C, the cover layer 12 exposes a periphery of the metal layer 11, and a periphery of the transparent conducting oxide layer 13 extends towards the metal layer 11 and is electrically connected to the periphery of the metal layer 11 that is exposed by the cover layer 12. The manners to connect the transparent conducting oxide 13 and the metal layer 11 as shown in FIGS. 1A and 1C may be combined.

Figure 1B:
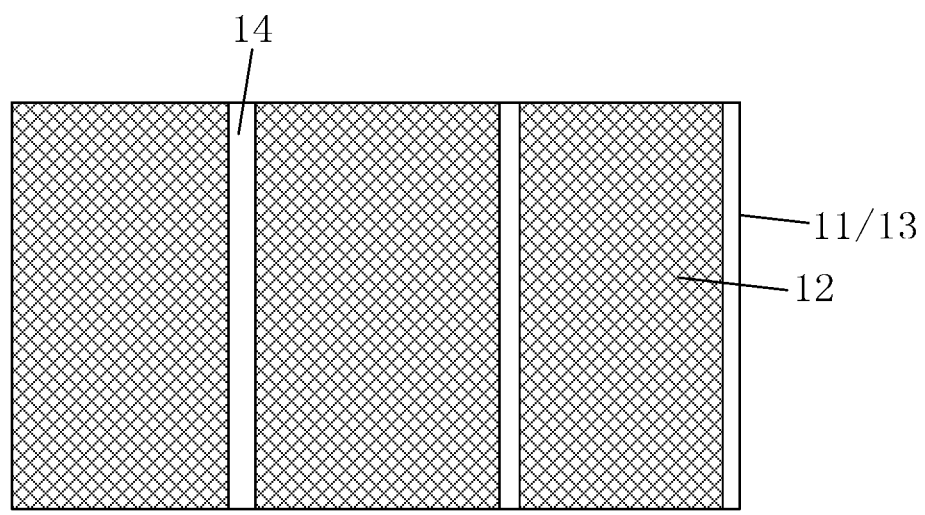
FIG. 1B is a schematic diagram showing a top view structure of the composite transparent electrode provided by the embodiments of the present disclosure.
Figure 1C:
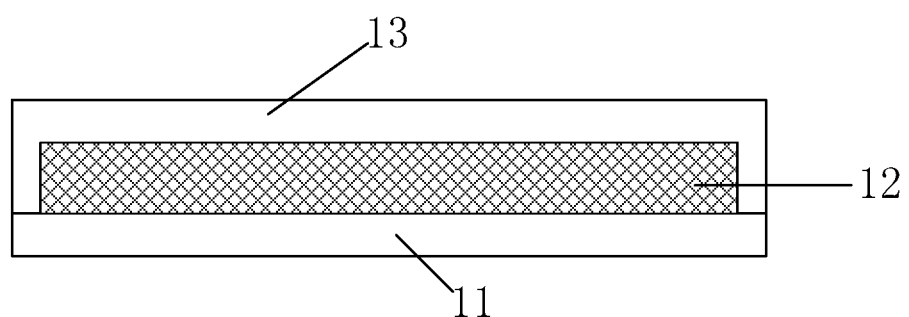
FIG. 1C is a schematic diagram showing a structure of another composite transparent electrode provided by the embodiments of the present disclosure.

For example, as shown in FIGS. 1A and 1B, an orthographic projection of the transparent conducting oxide layer 13 on the metal layer 11 is located within an area in which the metal layer 11 is located, for example, is overlapped with the entire metal layer 11.

For example, an orthographic projection of the first hole 14 on the metal layer 11 may be a closed ring, or a bar-shaped structure (as shown in FIG. 1B), or any other structure, as long as it can enable the connection between the metal layer 11 and the transparent conducting oxide layer 13.

For example, as shown in FIGS. 1A and 1B, an orthographic projection of the cover layer 12 on the metal layer 11 is located within an area in which the metal layer 11 is located.

For example, as shown in FIG. 1A, the cover layer 12 directly contacts the metal layer 11. For example, the cover layer 12 further directly contacts the transparent conducting oxide layer 13.

The composite transparent electrode according to the embodiments of the present disclosure is provided with a cover layer 12 between the metal layer 11 and the transparent conducting oxide layer 13, wherein the transparent conducting oxide layer 13 as an auxiliary electrode is connected to the metal layer 11 through the first hole 14 to increase the electrical conductivity and decrease the pressure fall. When the composite transparent electrode is used in an OLED, the cover layer 12 can reduce the plasma effect on the interface of the metal layer 11 in order to increase the light extraction efficiency. Furthermore, in the sputtering process for forming the transparent conducting oxide layer 13, the cover layer 12 can protect the metal layer 11 and reduce damages to the metal layer 11 during the sputtering process.

At least one embodiment of the present disclosure provides a composite transparent electrode. As shown in FIG. 1A, the composite transparent electrode comprises a metal layer 11, a transparent conducting oxide layer 13, and a transparent cover layer 12 located between the metal layer 11 and the transparent conducting oxide layer 13. For example, the cover layer 12 has one or more first holes 14, through which the metal layer 11 is connected to the transparent conducting oxide layer 13.

For example, the material of the cover layer 12 includes a metal oxide. For example, the cover layer 12 is formed from a metal oxide (that is, the material of the cover layer 12 only includes the metal oxide) having a dielectric constant ε in a range of ε>10.

It is to be noted that the material within said range can reduce the plasma effect on the interface of the metal layer 11, and at the same time can reduce damages to the organic light-emitting functional layer 3 during the sputtering process. For example, the material of the metal oxide can be selected from any one or more of $Ga_2O_3$, $CaO$, $WO_3$ or the like having a high dielectric constant.

For example, the material for forming the cover layer 12 may include an insulated material or a semiconductor material.

As an optional implementation of the embodiments in the present disclosure, for example, the metal layer 11 is formed from an Ag material (i.e., the material of the metal layer 11 includes only silver), and the transparent conducting oxide layer 13 is formed from TCO (transparent conducting oxide) (i.e., the material of the transparent conducting oxide layer 13 includes only TCO).

For example, the cover layer 12 has a thickness of 1 to 40 nm, such as 1 nm; the metal layer 11 has a thickness of 1 to 20 nm, such as 10 nm; a portion of the transparent conducting oxide layer 13 that covers the cover layer 12 has a thickness of 50 to 500 nm, such as 300 nm.

As another optional implementation of the embodiments in the present disclosure, for example, the metal layer 11 is formed from an Ag material, and the transparent conducting oxide layer 13 is formed from ITO (indium tin oxide). The cover layer 12 has a thickness of 40 nm; the metal layer 11 has a thickness of 1 nm; the transparent conducting oxide layer 13 has a thickness of 500 nm.

As another optional implementation of the embodiments in the present disclosure, for example, the metal layer 11 is formed from an Ag material, and the transparent conducting oxide layer 13 is formed from IZO (indium zinc oxide). The cover layer 12 has a thickness of 20 nm; the metal layer 11 has a thickness of 20 nm; the transparent conducting oxide layer 13 has a thickness of 50 nm.

As another optional implementation of the embodiments in the present disclosure, for example, the metal layer 11 is formed from an Ag material, and the transparent conducting oxide layer 13 is formed from IZO. The cover layer 12 is formed from $WO_3$ and has a thickness of 20 nm; the metal layer has a thickness of 10 nm; the transparent conducting oxide layer 13 has a thickness of 300 nm. The composite transparent electrode and an electrode not comprising a cover layer are tested simultaneously, and the result of the test is as shown in Table 1. The transmissivity of the composite transparent electrode T % is measured by a UV-visible spectrograph (PerkinElmer, Lambda 750S), and the instrument performances (current density, brightness, efficiency) are measured by a digital source meter Keithley 2400 and a brightness meter CS1000.

TABLE 1

| Composite transparent electrode | T % @ 550 nm | Current density (mA/cm$^2$) | Brightness (nits) | Efficiency (cd/A) |
|---|---|---|---|---|
| Ag(10 nm)/WO$_3$(0)/ IZO(300 nm) | 50% | 10 | 690 | 6.9 |
| Ag(10 nm)/WO$_3$(20 nm)/ IZO(300 nm) | 69% | 10 | 970 | 9.7 |

Figure 2:
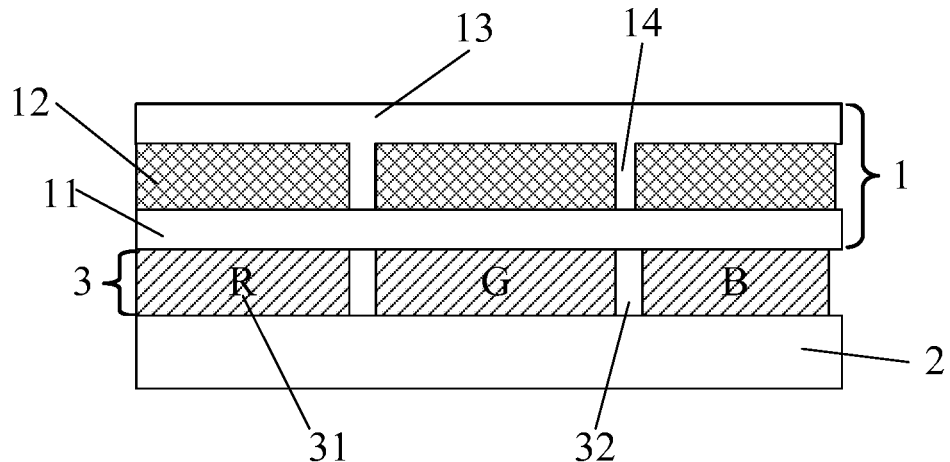
FIG. 2 is a schematic diagram showing a structure of the organic light-emitting diode provided by the embodiments of the present disclosure.

At least one embodiment of the present disclosure provides an organic light-emitting diode and a method for manufacturing thereof. As shown in FIG. 2, the organic light-emitting diode comprises a first electrode 2, a second electrode, and an organic light-emitting functional layer 3 located between the first electrode 2 and the second electrode, wherein the second electrode is the composite transparent electrode 1 according to any of the above embodiments, the transparent conducting oxide layer 13 is disposed away from the organic light-emitting functional layer 3, i.e., the transparent conducting oxide layer 13 is located on a side of the metal layer 11 away from the organic light-emitting functional layer 3. In other words, the composite transparent electrode 1 covers the organic light-emitting functional layer 3, and the metal layer 11 of the composite transparent electrode 1 is located between the organic light-emitting functional layer 3 and the transparent conducting oxide layer 13.

For example, as shown in FIG. 2, the cover layer 12 is provided with at least one first hole 14, through which the metal layer 11 is electrically connected to the transparent conducting oxide layer.

For example, the organic light-emitting diode may have a top-emitting structure. In this case, the composite transparent electrode 1 is located on a light-emitting side of the organic light-emitting diode.

For example, the first electrode 2 may be a non-transparent reflective electrode or a transparent electrode, and may have a single-film structure or a multi-film structure.

For example, as shown in FIG. 2, the organic light-emitting functional layer 3 comprises a plurality of subpixels 31 arranged in sequence along a direction parallel to the first electrode 2, there is a second hole 32 between adjacent subpixels 31, and the cover layer 12 covers the subpixels 31.

For example, along a direction in which the plurality of subpixels 31 are arranged, the size of the first hole 14 is less than or equal to that of the second hole 32. For example, an orthographic projection of the plurality of first holes 13 at the composite transparent electrode 1 on the metal layer 11 is located within an orthographic projection of the second hole 32 at the organic light-emitting functional layer 3 on the metal layer 11.

For example, an entire orthographic projection of the subpixels 31 at the organic light-emitting functional layer 3 on the metal layer 11 is located within an orthographic projection of the cover layer 12 on the metal layer 11.

For example, as shown in FIG. 2, the plurality of subpixels comprised in the organic light-emitting functional layer 3 of the light-emitting diode have different colors. For example, the plurality of subpixels include red subpixels R, green subpixels G and blue subpixels B, with adjacent subpixels having different colors.

For example, in the case that the organic light-emitting functional layer 3 comprises a plurality of subpixels 31, the organic light-emitting diode further comprises an insulated material in the second hole 32 between the subpixels 31 of the organic light-emitting functional layer 3 to prevent the composite transparent electrode 1 from being filled into the second holes 32 that will cause short-circuiting between the first electrode 2 and the composite transparent electrode 1.

Figure 3:
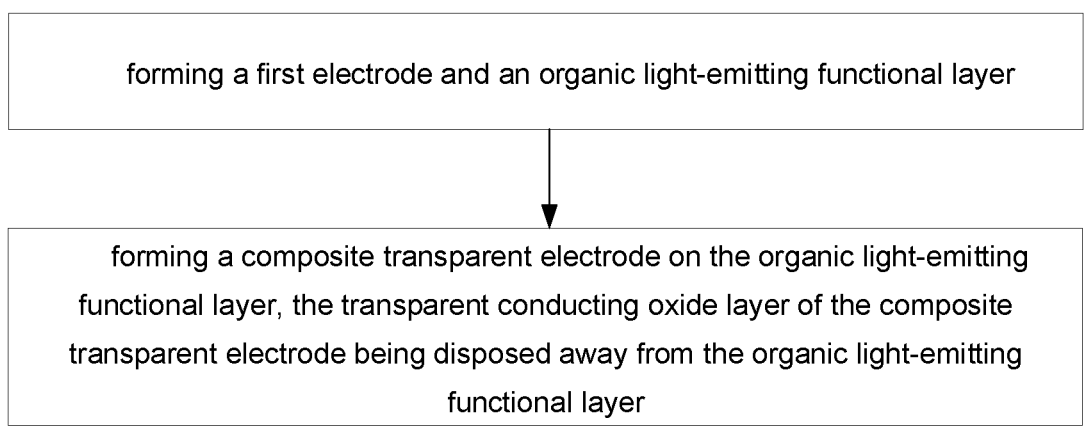
FIG. 3 is a flow chart showing a method for manufacturing the organic light-emitting diode provided by the embodiments of the present disclosure.

At least one embodiment of the present disclosure further provides a method for manufacturing an organic light-emitting diode. As shown in FIG. 3, the method comprises: forming a first electrode and an organic light-emitting functional layer; forming the composite transparent electrode according to any of the above embodiments on the organic light-emitting functional layer, wherein the transparent conducting oxide layer of the composite transparent electrode is disposed away from the organic light-emitting functional layer, i.e., the transparent conducting oxide layer is located on a side of the metal layer away from the organic light-emitting functional layer. For example, a first electrode and an organic light-emitting functional layer are firstly formed, and then a composite transparent electrode is formed.

For example, forming the transparent composite electrode comprises: firstly forming a metal layer and then forming a cover layer, and subsequently, forming a transparent conducting oxide layer.

For example, the transparent conducting oxide layer is formed by a sputtering process.

The method for manufacturing an organic light-emitting diode provided by the embodiments of the present disclosure is described in detail below taking the organic light-emitting diode as shown in FIG. 2 as an example.

In the step of forming a first electrode 2, for example, a transparent electrode which is an ITO/Ag/ITO reflective electrode (i.e., the reflective electrode has a structure in which an ITO layer, an Ag layer and an ITO layer are laminated in sequence) or ITO formed on a substrate is used as the first electrode 2.

In the step of forming an organic light-emitting functional layer 3, for example, the organic light-emitting functional layer 3 comprises subpixels 31, and the organic light-emitting functional layer 3 may be formed on the first electrode 2 by evaporation. For example, the organic light-emitting functional layer 3 comprises laminated Hole Injection Layer (HIL), Hole Transport Layer (HTL), Emitting Material Layer (EML), Electron Transport Layer (ETL) and Electron Injection Layer (EIL).

For example, in the case that the organic light-emitting functional layer 3 comprises a plurality of subpixels 31, the manufacturing method provided by at least one embodiment of the present disclosure further comprises filling an insulated material into the second hole 32 between the subpixels 31 of the organic light-emitting functional layer 3 to prevent composite transparent electrode 1 formed subsequently from being filled into the second hole 32.

For example, forming the composite transparent electrode 1 on the organic light-emitting functional layer 3 comprises forming in sequence a metal layer 11, a cover layer 12 and a transparent conducting oxide layer 13. For example, the metal layer 11 is formed by a first evaporation process, the cover layer 12 is formed by a second evaporation process (for example, the mask plate used in the second evaporation process and the mask plate used in the process for evaporating the organic light-emitting functional layer are the same mask plate), and the transparent conducting oxide layer is formed by a sputtering process.

For example, the forming of the composite transparent electrode 1 comprises the following steps (3.1)-(3.3).

Step (3.1): using a mask plate to evaporate a metal layer 11 on the organic light-emitting functional layer 3. For example, a layer of Ag having a thickness of 1 to 20 nm is evaporated as the metal layer 11.

For example, in the case that the light-emitting functional layer 3 comprises a plurality of subpixels 31, the metal layer 11 covers the plurality of subpixels 31 of the light-emitting functional layer 3 and is not filled into the second hole 32 between the subpixels 31.

Step (3.2): next, using, for example, a fine metal mask plate (FMM) (such as a mask plate for evaporating the organic functional layer) to evaporate a cover layer 12 formed from, for example, a metal oxide. For example, the cover layer 12 has a thickness of 1 to 40 nm, such as 20 nm. A cover layer 12 having a thickness of less than 1 nm is too thin to have a covering and protection effect; a cover layer 12 having a thickness of greater than 40 nm would result in a reduced transmissivity, which would decrease the light extraction efficiency.

Step (3.3): finally, forming a layer of TCO as the transparent conducting oxide layer 13, using, for example, a sputtering manner. For example, the TCO has a thickness of 50 to 500 nm, such as 300 nm. If the transparent conducting oxide layer 13 is too thin, the resistance thereof would be great, such that the pressure fall cannot be decreased; if the transparent conducting oxide layer 13 is too thick, the manufacturing process would take more time, such that it is not adaptable to mass production.

As an optional implementation in the present embodiment, the organic light-emitting functional layer 3 comprises a plurality of subpixels 31, there is a second hole 32 between adjacent subpixels 31, the cover layer 12 covers the subpixels 31, and the size of the first hole 14 is less than or equal to that of the second hole 32.

That is, the hole of the FMM in the step (3.2) is less than or equal to the hole of the subpixels 31 in the step (2). In this case, the cover layer 12 nearly totally covers the location at which the subpixels 31 locates, and in the subsequent step (3.3), the cover layer 12 can protect the subpixels 31 of the organic light-emitting functional layer 3 and reduce damages to the organic light-emitting functional layer 3 during the sputtering process.

Obviously, the specific implementations in the above embodiments may have a number of variations. For example, the specific thickness for each of the respective layers of the composite transparent electrode may be adjusted as necessary, and the material for each of the respective layers of the composite transparent electrode may be selected according to the need of the product.

Figure 4:
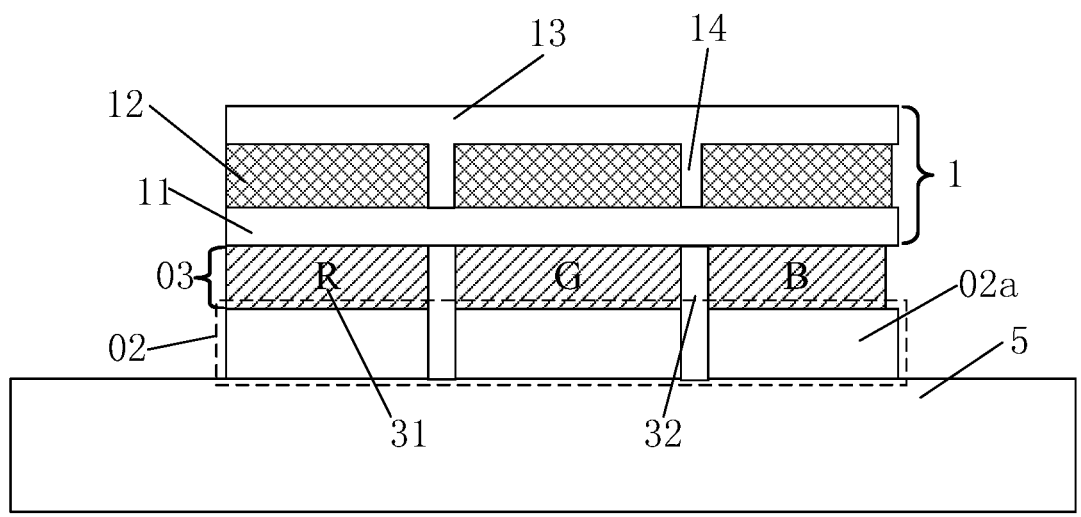
FIG. 4 is a schematic diagram showing a structure of the array substrate provided by the embodiments of the present disclosure.

At least one embodiment of the present disclosure further provides an array substrate. As shown in FIG. 4, the array substrate comprises a substrate 5, an electrode layer 02 thereon, the composite transparent electrode 1 according to any of the above embodiments, and an organic light-emitting functional layer 03 located between the electrode layer 02 and the composite transparent electrode 1, wherein the electrode layer 02 comprises a plurality of sub-electrodes 02a (for example, each sub-electrode 02a may be a first electrode 2 in the above embodiment of the organic light-emitting diode), and the organic light-emitting functional layer 03 comprises a plurality of subpixels (for example, comprising red subpixels R, green subpixels G and blue subpixels B).

For example, as shown in FIG. 4, an orthographic projection of the gaps between the sub-electrodes 02 on the metal layer 11 is located within an area in which an orthographic projection of the gaps between the subpixels on the metal layer 11 is located.

At least one embodiment of the present disclosure provides a display device, comprising the above-mentioned array substrate. The display device may be any product or component having a display function, such as electronic paper, an OLED panel, a mobile phone, a tablet computer, a television set, a display, a notebook computer, a digital photo frame, a navigator and the like.

In summary, the composite transparent electrode according to the embodiments of the present disclosure is provided with a cover layer between the metal layer and the transparent conducting oxide layer, wherein the transparent conducting oxide layer as an auxiliary electrode is connected to the metal layer through the first hole to increase the electrical conductivity and decrease the pressure fall. When the composite transparent electrode is used in an OLED, the cover layer can reduce the plasma effect on the interface of the metal layer to increase the light extraction efficiency. Furthermore, in the sputtering process for forming the transparent conducting oxide layer, the cover layer can protect the metal layer and the organic light-emitting functional layer, and reduce damages to the metal layer and the organic light-emitting functional layer during the sputtering process. The OLED according to the embodiments of the present disclosure is applicable to various kinds of display devices.

The above are only illustrative embodiments of the present disclosure, but shall not be used to limit the protection scope of the present disclosure. The protection scope of the present disclosure shall be determined by the attached claims.

What is claimed is:

1. An organic light-emitting diode, comprising a first electrode, a second electrode, and an organic light-emitting functional layer located between the first electrode and the second electrode, wherein the second electrode is a composite transparent electrode, the composite transparent electrode comprising:
a metal layer;
a transparent conducting oxide layer, wherein the transparent conducting oxide layer is located on a side of the metal layer away from the organic light-emitting functional layer; and
a transparent cover layer located between the metal layer and the transparent conducting oxide layer,
wherein the metal layer is electrically connected to the transparent conducting oxide layer;
wherein the transparent cover layer has at least one first through-hole, through which the metal layer is electrically connected to the transparent conducting oxide layer;
wherein the at least one first through-hole comprises a material of the transparent conducting oxide layer therein; and
wherein the at least one first through-hole is a bar-shaped structure.

2. The organic light-emitting diode according to claim 1, wherein a material of the transparent cover layer comprises a metal oxide having a dielectric constant ε in a range of ε>10.

3. The organic light-emitting diode according to claim 2, wherein the transparent cover layer is insulated.

4. The organic light-emitting diode according to claim 2, wherein the metal oxide is selected from a group of $Ga_2O_3$, CaO and $WO_3$.

5. The organic light-emitting diode according to claim 1, wherein the transparent cover layer has a thickness in a range of 1 to 40 nm.

6. The organic light-emitting diode according to claim 1, wherein the transparent cover layer directly contacts the metal layer.

7. The organic light-emitting diode according to claim 1, wherein the metal layer has a thickness in a range of 1 to 20 nm.

8. The organic light-emitting diode according to claim 1, wherein the metal layer is a transparent metal layer.

9. The organic light-emitting diode according to claim 1, wherein the transparent conducting oxide layer has a thickness in a range of 50 to 500 nm.

10. The organic light-emitting diode according to claim 1, wherein an orthographic projection of the transparent conducting oxide layer on the metal layer is located within an area in which the metal layer is located.

11. The organic light-emitting diode according to claim 1, wherein the organic light-emitting functional layer comprises a plurality of subpixels and at least one second hole, wherein the at least one second hole is between adjacent subpixels, and the transparent cover layer covers the subpixels.

12. The organic light-emitting diode according to claim 11, wherein along a direction in which the plurality of subpixels are arranged, a size of the at least one first through-hole is less than or equal to that of the at least one second hole.

13. The organic light-emitting diode according to claim 11, wherein an orthographic projection of the subpixels on the metal layer of the composite transparent electrode is located within the orthographic projection of the transparent cover layer on the metal layer.

14. A composite transparent electrode, comprising:
a metal layer;
a transparent conducting oxide layer; and
a transparent cover layer located between the metal layer and the transparent conducting oxide layer,
wherein the metal layer is electrically connected to the transparent conducting oxide layer;
wherein the transparent cover layer has at least one first through-hole, through which the metal layer is electrically connected to the transparent conducting oxide layer;
wherein the at least one first through-hole comprises a material of the transparent conducting oxide layer therein; and
wherein the at least one first through-hole is a bar-shaped structure.

15. The composite transparent electrode according to claim 14, wherein the transparent cover layer exposes a periphery of the metal layer, and a periphery of the transparent conducting oxide layer extends towards the metal layer and is electrically connected to the periphery of the metal layer that is exposed by the transparent cover layer.

16. A method for manufacturing an organic light-emitting diode, comprising:
   forming a first electrode and an organic light-emitting functional layer; and
   forming the composite transparent electrode according to claim 14 on the organic light-emitting functional layer, wherein the transparent conducting oxide layer is located on a side of the metal layer away from the organic light-emitting functional layer.

17. The method for manufacturing an organic light-emitting diode according to claim 16, wherein the transparent conducting oxide layer is formed by a sputtering process.

18. An array substrate, comprising an electrode layer, the composite transparent electrode according to claim 14, and an organic light-emitting functional layer located between the electrode layer and the composite transparent electrode, wherein the electrode layer comprises a plurality of sub-electrodes, and the organic light-emitting functional layer comprises a plurality of subpixels.

* * * * *